United States Patent
Liu et al.

(10) Patent No.: US 6,825,120 B1
(45) Date of Patent: Nov. 30, 2004

(54) METAL SURFACE AND FILM PROTECTION METHOD TO PROLONG Q-TIME AFTER METAL DEPOSITION

(75) Inventors: Chi-Wen Liu, Hsin-Chu (TW); Ying-Lang Wang, Tai-Chung County (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/176,855

(22) Filed: Jun. 21, 2002

(51) Int. Cl.[7] .......................................... H01L 21/461
(52) U.S. Cl. ...................................... 438/693; 216/67
(58) Field of Search ............................... 438/618, 622, 438/692, 693; 216/67, 79, 89; 156/643.1, 646.1

(56) References Cited

U.S. PATENT DOCUMENTS

| | | | |
|---|---|---|---|
| 5,770,095 A | 6/1998 | Sasaki et al. | 216/38 |
| 6,117,783 A | 9/2000 | Small et al. | 438/693 |
| 6,207,559 B1 | 3/2001 | Jiang | 438/653 |
| 6,620,215 B2 * | 9/2003 | Li et al. | 438/692 |
| 2003/0032292 A1 * | 2/2003 | Noguchi | 438/692 |
| 2004/0046261 A1 * | 3/2004 | Ohto et al. | 438/622 |

FOREIGN PATENT DOCUMENTS

JP   08-064594   *   8/1996

* cited by examiner

*Primary Examiner*—Kamand Cuneo
*Assistant Examiner*—Lisa Kilday

(57) ABSTRACT

The present invention relates to a method of protecting a fresh metal surface, preferably copper, after a metal deposition step. The metal deposition is preferably part of single or dual damascene process. The metal surface is treated with an amine, preferably BTA, to form a metal complex that is a hydrophobic monolayer and prevents the underlying metal from reacting to form oxides that can degrade device performance. The amine can be applied in various ways including dipping, spraying, spin coating, and by a CVD method. The sacrificial protective layer can remain on the substrate during a storage period of up to hours or days before it is removed in a subsequent chemical mechanical polish step. The use of a sacrificial protective layer improves throughput in a damascene process by allowing long queue times between metal deposition and CMP which gives more flexibility to production flow and reduces cost.

30 Claims, 2 Drawing Sheets

METAL SURFACE AND FILM PROTECTION METHOD TO PROLONG Q-TIME AFTER METAL DEPOSITION

FIELD OF THE INVENTION

The present invention relates to a method of fabricating integrated circuits in microelectronic devices. In particular, the invention relates to a method of protecting a metal surface from oxidation for an indefinite time after a metal deposition step.

BACKGROUND OF THE INVENTION

Integrated circuit manufacturers, especially those producing logic and custom logic devices, are moving to copper metallization for their most advanced products. Copper is replacing aluminum for metal interconnections in back end of the line processes because of its better conductivity and lower resistivity. However, copper diffuses more easily through dielectric materials that are used as insulating layers and requires a barrier material as a liner on the sidewalls of trenches before the metal is deposited by electroplating, chemical vapor deposition (CVD) or by sputtering methods.

A damascene process is used to build the back end of the device that includes metal wiring for interconnects. Typically, the process involves forming a stack comprised of one or more etch stop and barrier layers and one or more dielectric layers. A pattern is formed in the stack by first patterning a photoresist layer on the stack and then using the photoresist as an etch mask to transfer the pattern by etching into the damascene stack to form a feature such as a trench or via hole. In a dual damascene process, a liner is deposited in a trench and via hole and then a metal is simultaneously deposited to fill both the trench and via hole. The metal is deposited to a level above the damascene stack and is then lowered to a level that is coplanar with the top of the damascene stack by means of a chemical mechanical polish (CMP) step.

In the copper damascene process, the maintenance of a fresh copper surface after the deposition step has become a big challenge in the industry. Thin and discontinuous copper oxides exist intrinsically on substrates with an exposed copper surface in the presence of moisture and oxygen. Copper oxides lead to poor adhesion both at the copper/barrier layer and at copper/etch stop layer interfaces and enhance copper hillock formation during thermal processes. Thermal stress induces copper volume expansion and if there are any free spaces in the copper layer, hillocks will form. In addition, since an electroplated copper film has a polycrystalline structure with many grain boundaries, copper oxides will grow not only on the surface but also deep into a copper film along grain boundaries if the surface is exposed to moisture for a long period. The oxidized copper grain boundaries may extend into the trench below the top level of the damascene stack where they are very difficult to remove. Both single and dual damascene processes are employed in the industry.

Current manufacturing operations require a CMP step as soon as possible after the copper deposition to avoid copper oxide induced damage. This practice places unacceptable demands on a production line because of very short queue times (Q-times). Normal delays between processing steps may vary from minutes to hours or days and it is unrealistic to control one delay time to a very short interval at the expense of interrupting other operations which will cause a loss of throughput and increased cost of making a product.

Therefore, it is an advantage in the fabrication of devices employing copper damascene interconnects to be able to protect fresh copper surfaces such that they can be stored for indefinite periods of time without sustaining any copper oxide growth that will damage device performance. It will be a further advantage for an improved process not to require any new tools that will add to the manufacturing cost of the device and to be useful in protecting aluminum and aluminum/copper layers as well which are alternative metals for damascene structures that also form undesirable oxides.

Copper chelates or complexes with amines such as benzotriazole (BTA) have been employed in CMP slurries to form a protective coating on depressions in a metal surface while the higher points of the metal surface are being worn down by a combination of chemical etching and physical abrasion. U.S. Pat. No. 6,117,783 describes the use of BTA in combination with an oxidizing or reducing agent and an abrasive agent in an acidic media during a CMP process with copper. However, BTA is used only to control isotropic etching during the CMP process and does not remain on the substrate as a distinct layer and protective coating between process steps.

U.S. Pat. No. 5,770,095 describes an improved polishing method including BTA as part of a CMP slurry that also contains an etchant, oxidizer, and grinding media. The copper chelate with BTA only exists in the presence of etching, oxidizing, and grinding materials during the polishing process and never forms a distinct layer that can be stored for hours or days before the next step.

U.S. Pat. No. 6,207,559 describes the use of $Cu^{+1}(BTA^{-1})$ or $Cu^{+2}(BTA^{-1})_2$ as a protective layer in a stack that forms an electrical connection between the bond pad of a chip and the bond pad of a substrate in a memory device. The layer is less than 30 Angstroms thick and remains as a permanent layer in the device. The BTA is applied to the copper surface in a neutral solvent. If BTA was applied as part of an acidic or basic solution, cations or anions from the solution may become trapped in the $Cu^+(BTA)$ layer and result in a contamination that would degrade the device performance. Other amines that can form complexes with copper are also cited as useful for forming protective layers. When a layer becomes a permanent part of a device, strict controls on purity, thickness, thermal stability, and composition are required to maintain a maximum device performance. These controls can lead to a higher cost because of the effort and expense needed to guarantee the tight specifications.

Thus, a protective layer is needed for freshly deposited metal layers in damascene processes, especially those involving copper, which adds minimal cost to the manufacture of the device. Such a layer is best achieved when it is a sacrificial layer which exists for a period of only hours or days and does not become a permanent part of a device. The layer should be applied separately from other materials such as etchants and oxidants that could attack the sacrificial layer or underlying copper while the substrate is in storage. There is also a need for an improved process of applying a protective layer that is compatible with a high throughput mode involving little or no testing of the protective layer. It would also be desirable for the sacrificial protective layer to be applicable to the manufacture of other devices not involving damascene structures but requiring metal deposition techniques.

SUMMARY OF THE INVENTION

An objective of the present invention is to provide a sacrificial protective layer for a fresh metal surface after metal deposition and preferably before a chemical mechanical polishing (CMP) step in a damascene process. More specifically, the protective layer should prevent oxidation on the surface of the metal and along the grain boundaries below the metal surface. The protective layer must be stable and resistant to moisture and should have the capability to remain on the metal for an indefinite period of time before being removed in a subsequent process. The removal of the sacrificial layer should not add extra process time to fabrication process if it can be incorporated into an existing manufacturing step such as a CMP step.

Another objective of the present invention is to provide a method of forming a sacrificial protective layer on a metal layer on a substrate such that unreacted materials from the reagent used to treat the metal are removed prior to subsequent process steps. The process of forming the sacrificial layer and removing unreacted materials should be compatible with a low cost and high throughput mode of manufacturing.

Another objective is to provide a method of using the sacrificial protective layer during the fabrication of a microelectronic, micro-electromechanical, or LCD device in which a metal is deposited on a substrate and an indefinite storage time occurs before the next process step. The sacrificial protective layer prevents the underlying metal from forming oxides during the storage period that would cause a degradation in device performance.

These objectives are achieved in the following embodiments of the present invention. In one embodiment, the present invention is a sacrificial protective layer that is formed on a fresh metal surface and prevents metal oxides from forming. In a preferred example, the layer is a monolayer formed by applying an amine to a copper layer on a substrate which reacts to form a copper complex with the amine. The copper complex is hydrophobic and prevents moisture from reacting with the underlying copper to produce oxides. The layer is stable and can remain on the substrate for an indefinite storage time. It forms a conformal coating on the copper surface such that an equal thickness is formed which is independent of the slope of the surface. Thus, the copper surface of the substrate is protected to an equal extent no matter if the localized surface is perpendicular to the substrate, parallel to the substrate, in a depression or on a higher point than surrounding areas. This feature is distinguishable from a protective coating formed during a CMP process where the higher points of the surface are less protected and preferentially removed than lower points on the surface.

The method of application can involve dipping, spraying, spin coating, or chemical vapor deposition (CVD) in order to improve throughput and reduce cost. The most efficient method of amine application and removal of amine can depend on the tools which are more available in the manufacturing line. If the amine is applied in a solution, the substrate is rinsed with DI water and dried after the application to prepare it for storage and a subsequent CMP step. If the amine is applied by spraying or in a CVD process, the amine is removed in a vacuum, by baking, or by a combination of the aforementioned conditions.

In another embodiment, the sacrificial protective layer is formed on a metal surface during a damascene process and is removed in a subsequent CMP step.

In another embodiment, the sacrificial protective layer is formed on a metal layer that has been deposited on a substrate during the fabrication of a microelectronic, micro-electromechanical, or LCD device. The substrate is stored for an indefinite period of time. The sacrificial layer is then removed by a process that does not degrade the performance of the underlying layer prior to the next step in the fabrication process.

BRIEF DESCRIPTION OF THE DRAWINGS

The drawings are intended to provide a more thorough understanding of the invention. The drawings illustrate embodiments of the invention and together with the detailed description serve to explain the principles of the present invention.

DETAILED DESCRIPTION OF THE INVENTION

The present invention relates to a method of protecting a fresh metal surface during the fabrication of a device, preferably involving a copper damascene structure, which prevents formation of oxides on the metal surface and along grain boundaries extending below the metal surface. The formation of the sacrificial protective layer improves throughput in the manufacturing line by allowing a longer Q-time or delay between a metal deposition step and a subsequent process step. In the case of a damascene process, a CMP step follows which lowers the metal surface to a level that is coplanar with the top of the damascene stack. The longer Q-times permit a larger degree of flexibility in the production line since the flow is not interrupted by placing a high priority on minimizing the Q-time between two particular steps in the production sequence.

Figure 1:
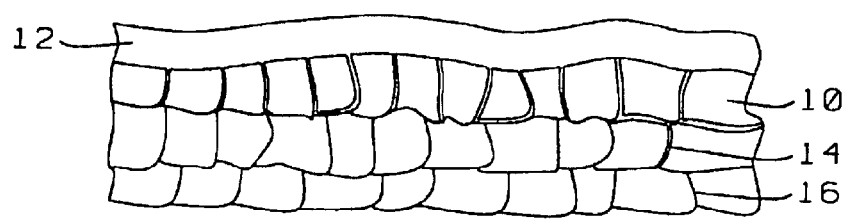
FIG. 1 is a cross-sectional view of a small portion of the surface and underlying region near the surface of a copper film that has not been protected and has reacted to form oxides on a surface layer and along grain boundaries within the copper film.

FIG. 1 is a cross-sectional view of a portion of a copper surface that does not have a protective layer. A copper oxide layer 12 has formed on the surface of the original copper film after it was exposed to moisture. Each of the copper grains 10 is surrounded by a grain boundary that has oxidized in areas where the grain boundary is light colored 14 and remains unoxidized in boundary areas 16 with dark color. The oxidized boundaries can extend through many layers of copper grains below the surface and can degrade device performance if they extend into regions of the copper film that are not removed in a subsequent step.

Figure 2:
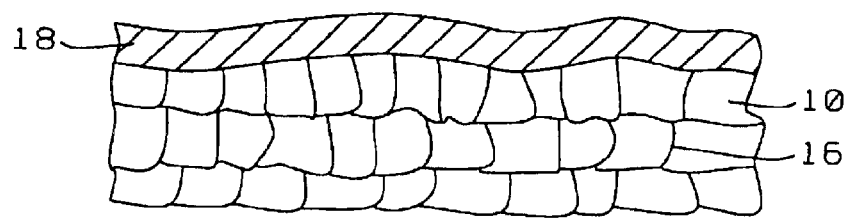
FIG. 2 is a cross-sectional view of a small portion of the surface and underlying region near the surface of a copper film that has a sacrificial protective layer in accordance with the present invention.

Referring to FIG. 2, a cross sectional view illustrates the top portion of a copper film that has been covered with a sacrificial protective layer 18 according to the present invention. The copper grains 10 are surrounded by boundary areas 16 that all remain unoxidized because the sacrificial protective layer 18 is hydrophobic and does not allow moisture to penetrate into the film.

In the first embodiment, a sacrificial protective layer 18 as shown in FIG. 2 is formed on a freshly deposited metal film which is preferably copper. The metal can be deposited by various methods including but not limited to electroplating, sputtering, evaporation, and CVD. Generally, the protective layer should be formed no later than four hours after the metal film is deposited to ensure that the surface is still fresh and free from oxide formation. Layer 18 is a monolayer with a thickness between about 10 and 50 Angstroms and has the same thickness on all localized parts of the surface whether it is vertical slope, horizontal slope, in a depression or on a high point of the surface. Thus, all parts of the metal surface are equally protected unlike a protective film formed during a CMP step in which the higher points of the metal layer are less protected and are preferentially removed by a grinding process.

In the case of copper deposition, the sacrificial protective layer is formed by applying an amine to the copper surface which reacts with the copper to form a copper complex. The copper complex is comprised of a copper cation in the +1 or +2 state in which one or two electrons have been transferred to an amine to form an anion. The sacrificial layer consisting of the $Cu^{+1}(amine^{-1})$ or $Cu^{+2}(amine^{-1})_2$ complex is hydrophobic and prevents water from attacking the underlying metal layer.

The amine can be applied as a solution in dilute acid. In this case, the substrate with a fresh copper surface is dipped into the amine solution consisting of 0.1 parts amine in 100 parts of dilute HCl. The acidic solution containing the amine may also be spin coated on the substrate. When spin coating, a puddle of the BTA solution is placed on the center of the substrate and the substrate is rotated to cover the surface with the reagent. Another variation of spin coating is to apply enough solution to entirely cover the substrate in a stationary position for several seconds and then spin the substrate to remove most of the unreacted solution. In the case of dipping or spin coating, once the amine treatment period is ended, the substrate is rinsed with DI water to remove the remaining unreacted amine. The substrate may then be baked to remove traces of water before the substrate is stored in a queue for a subsequent step which is a CMP process when manufacturing damascene structures. Storage is typically in an oxygen free atmosphere in a closed container.

The amine can also be sprayed on the surface of the substrate. In this method, a solution of the amine in organic solvent or in dilute acid is sprayed on the substrate and is allowed to remain on the substrate for several seconds. Then the unreacted amine and solvent are removed by vacuum or with a baking step or a combination of baking and vacuum to dry the substrate. If the amine solution in dilute acid is sprayed on the substrate, the substrate must be rinsed with DI water and dried before proceeding to the next process step. The substrate is normally stored in an oxygen free environment in a closed container before a subsequent step.

An amine could also be applied to a substrate by means of chemical vapor deposition in a chamber by conventional methods known to those skilled in the art.

The most efficient method of forming a sacrificial protective layer depends on the availability of immersion tanks, spin coating equipment, and CVD chambers in a manufacturing line. In each case, the content of the resulting metal complex with the amine is the same and a monolayer thickness is formed.

This sacrificial protective layer is distinguishable from a permanent layer since the formation of the latter must be carefully controlled with respect to purity, composition, thickness, and thermal stability. Any contaminants or variations in the quality of the permanent layer can cause a degradation or fluctuation in device performance. The additional effort to monitor the quality of a permanent protective layer leads to a higher cost of the device. On the other hand the quality control associated with a sacrificial protective layer is much less stringent. Specifically, the sacrificial layer may contain traces of contaminants such as chloride ion from the HCl solution. Trace amounts of contaminants are removed during a subsequent CMP step. The thermal stability requirement is not as high for the sacrificial layer since it is not subjected to a high temperature process like a permanent layer. Any costs associated with formation of a sacrificial layer and quality control of said layer are far outweighed by the increased manufacturing throughput and improved reliability of the copper layer which it protects. The formation of a sacrificial protective layer avoids expensive rework or loss of substrates due to oxidation of copper boundaries deep within the underlying copper layer.

Preferably the amine used to form the sacrificial protective layer is benzotriazole (BTA) but can also be any nitrogen containing compound that is capable of forming a complex with copper to give $Cu^{+1}$ (amine $^{-1}$) or $Cu^{+2}$ (amine$^{-1}$)$_2$. Other examples of amines useful for the present invention are derivatives of benzotriazole as well as benzimidazole and its derivatives.

Figure 3:
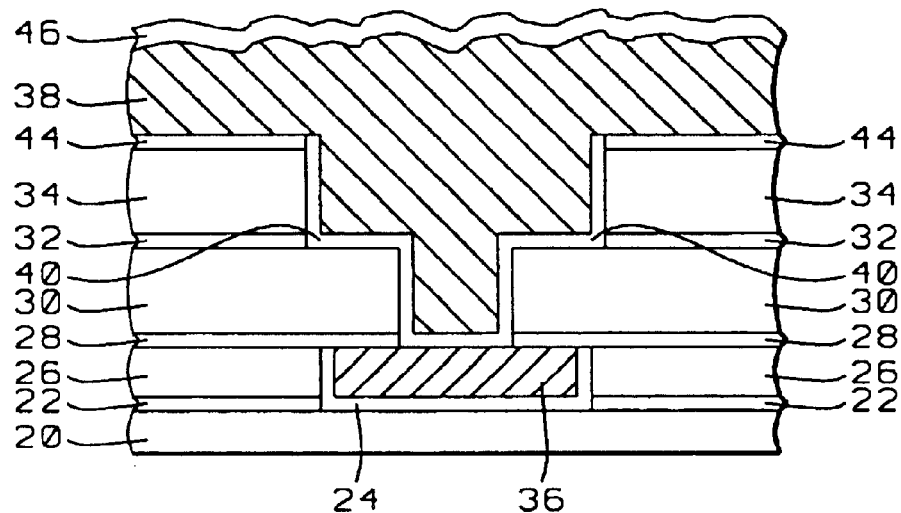
FIG. 3 is a cross-sectional view of a stack of layers in a dual damascene process after a metal deposition step and prior to a chemical mechanical polish (CMP) step. A sacrificial protective layer has been coated on top in accordance with an embodiment of the present invention.

In another embodiment, the sacrificial protective layer of the present invention is formed during a copper dual damascene process although the sacrificial layer performs equally well with aluminum or copper/aluminum alloys. Referring to FIG. 3, a substrate 20 is provided upon which an etch stop 22 and a dielectric layer 26 have been formed.

Etch stop 22 is comprised of an oxide, carbide or nitride such as silicon nitride while dielectric layer 26 can be fluorosilicate glass (FSG), a polyimide, SiO$_2$, FLARE from Allied Signal, SiLK from Dow Corning or other low k materials. A conventional process has been used to pattern dielectric layer 26 to form a trench that has been filled with a conductive material 36 such as copper. Optionally, a liner 24 that prevents moisture from reaching conductive material 36 is deposited before the metal deposition. This liner 24 is comprised of a material such as TaN, TiN, WN, and TaSiN. Conductive layer 36 is treated with a BTA solution according to the present invention to form a protective coating (not shown). The substrate is stored for an indefinite period of time and then a CMP step is used to lower the level of conductive layer 36 until it is coplanar with the top of dielectric layer 26. The protective BTA coating is removed during the CMP step.

Next an etch stop layer 28 similar in composition to etch stop 22 is deposited. A second dielectric layer 30 similar in composition to dielectric layer 26 is deposited and then a third etch stop layer 32 is formed. Etch stop layer 32 is selected from the same group of materials as etch stop layers 22 and 28. Next a third dielectric layer 34 similar in composition to dielectric layer 30 is deposited. A passivation layer 44 comprised of a nitride, oxide, or oxynitride is formed above the third dielectric layer 34. Layer 44 functions as an etch stop during a subsequent CMP step. A conventional sequence of patterning and etching processes can be followed to form a via hole that extends through layers 44, 34, 32, and 30 and a trench that extends through passivation layer 44 and dielectric layer 34. Following the trench etch, the etch stop layer 28 at the bottom of the via hole is removed by an etch stop. A liner 40 is formed on the side walls and bottom of the via opening and on the sidewall and base of the trench opening and is selected from the same group of materials as used in liner 24. A metal 38 is deposited to simultaneously fill the via and trench opening and form a layer above the level of passivation layer 44.

As shown in FIG. 3, a sacrificial protective coating 46 consisting of a copper complex with BTA is formed on metal 38 by dipping the substrate in a solution consisting of 0.1 parts BTA in 100 parts of dilute HCl followed by rinsing with DI water and drying. Formation of the protective layer 46 is a low cost process that does not require any new process tools. The substrate 20 is stored in an oxygen free atmosphere in a closed container and remains in queue until a subsequent CMP step is performed to lower the level of 38 to be coplanar with the top of passivation layer 44.

Figure 4:
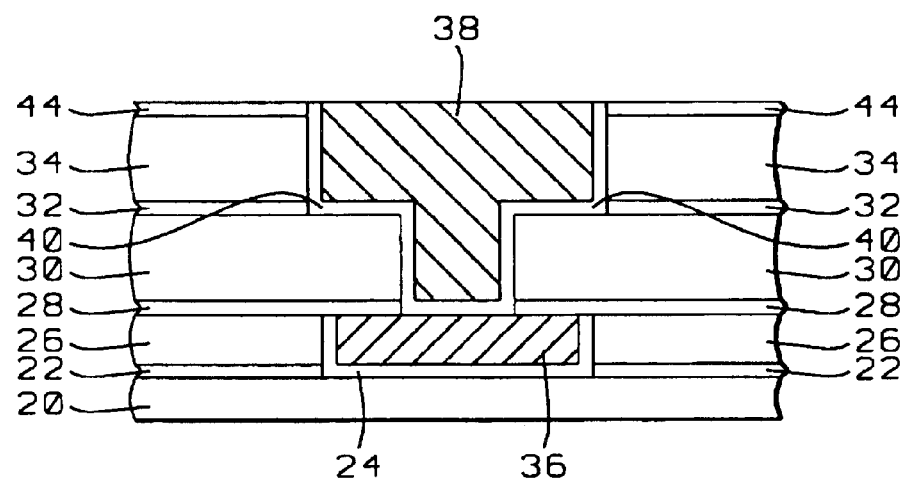
FIG. 4 shows a cross-sectional view of the dual damascene structure from FIG. 3 after a CMP step to smooth the metal surface and remove the sacrificial protective layer.

During the CMP process, the sacrificial protective coating 46 is removed to yield the dual damascene structure shown in FIG. 4. Removal of 46 does not require any additional process time and does not limit the throughput of the damascene process.

The method of forming a sacrificial protective layer on a fresh copper surface and removing it during a subsequent CMP step actually improves manufacturing throughput because the production flow is not gated to a short interval (Q-time) between copper deposition and CMP. The much longer Q-time between copper deposition and CMP allows a greater flexibility in the selection of which batch of substrates can be processed and which tools are available for various steps in the damascene process. Since the sacrificial protective layer can be applied at two different places in the damascene process, its use on two copper layers has two times the benefit of a single application.

Although FIG. 4 represents a dual damascene structure, the method of forming and removing a sacrificial protective layer on a fresh metal surface is also an advantage when a single damascene approach is used in manufacturing. The sequence of forming a trench in the damascene stack, depositing a barrier layer, and depositing a metal such as copper in the single damascene process is the same as for the dual damascene approach. An advantage is also gained in improving manufacturing throughput in a single damascene process because the Q-time between metal deposition and a subsequent CMP step is considerably lengthened to allow greater flexibility in the production flow.

As the processes used in the fabrication of microelectronic devices spread to the manufacture of other devices such as micro-electromechanical and LCD devices, it will become apparent that the present invention may be applied in a wide variety of applications. In an alternative embodiment, the sacrificial protective layer is formed on a freshly deposited metal layer. After removal of any unreacted amine reagent, the substrate is stored for an indefinite period of time. The sacrificial protective layer can then be removed in a CMP step or with another process that is not destructive to the underlying layer or the permanent part of the device. The resulting metal layer is free of metal oxides that can degrade device performance.

While this invention has been particularly shown and described with reference to, the preferred embodiments thereof, it will be understood by those skilled in the art that various changes in form and details may be made without departing from the spirit and scope of this invention.

We claim:

1. A method of forming a sacrificial protective layer on a freshly deposited metal layer on a substrate comprising:
   providing a substrate,
   depositing the metal layer,
   forming a sacrificial protective layer on the metal surface by treating the metal layer with an amine that forms a complex of the type $M^{+1}$ (amine$^{-1}$) or $M^{+2}$(amine$^{-1}$)$_2$ which is hydrophobic, and
   removing unreacted amine.

2. The method of claim 1 wherein the metal is deposited in an electroplating, sputtering, evaporating or CVD process.

3. The method of claim 1 wherein the metal is copper, aluminum or an aluminum/copper alloy.

4. The method of claim 1 wherein the amine is benzotriazole or benzimidazole.

5. The method of claim 1 wherein the method of applying the amine is by dipping or by spin coating.

6. The method of claim 5 wherein the dipping or spin coating application is further comprised of a solution of the amine in a dilute acid solution, preferably 0.1 parts amine in 100 parts of dilute HCl solution.

7. The method of claim 5 wherein the application is performed at room temperature.

8. The method of claim 1 wherein said complex forms a monolayer with a thickness in the range of about 10 to about 50 Angstroms.

9. The method of claim 1 wherein the amine is applied to the metal preferably within 4 hours after the metal is deposited.

10. The method of claim 1 wherein the amine is applied by spraying or a CVD process.

11. The method of claim 1 wherein the unreacted amine is removed by baking, by applying a vacuum or by rinsing with DI water and drying.

12. A method of using a sacrificial protective layer in a damascene process comprising:
    providing a substrate upon which a damascene stack has been formed,
    forming a trench and via hole in said damascene stack,
    depositing a barrier layer on the sidewalls and on the bottom of said trench and via hole,
    depositing a metal within said trench and via hole,
    forming a sacrificial protective layer on said metal by treating the metal layer with an amine that forms a complex of the type $M^{+1}$(amine$^{-1}$) or $M^{+2}$(amine$^{-1}$)$_2$, and
    removing unreacted amine from the substrate.

13. The method of claim 12 further comprising the step of removing the amine complex in a subsequent chemical mechanical polish step.

14. The method of claim 12 wherein said barrier layer is selected from a group consisting of Ti, Ta, TiW, W, TaN, TiN, WN, and TaSiN.

15. The method of claim 12 wherein said metal is copper, aluminum or an aluminum/copper alloy.

16. The method of claim 12 wherein said metal is deposited in an electroplating, sputtering, evaporating, or CVD process.

17. The method of claim 12 wherein the amine is selected from a group consisting of benzotriazole and its derivatives and benzimidazole and its derivatives.

18. The method of claim 12 wherein said sacrificial protective layer is a monolayer with a thickness in a range of about 10 Angstroms to about 50 Angstroms.

19. The method of claim 12 wherein the amine is applied by dipping or spin coating a solution of the amine in a dilute acid, preferably 0.1 parts of the amine in 100 parts of a dilute HCl solution.

20. The method of claim 19 wherein the application of the amine is performed at room temperature.

21. The method of claim 12 wherein the unreacted amine is removed by baking, by applying a vacuum or by rinsing with DI water and drying.

22. The method of claim 12 wherein the amine is applied by spraying or a by a CVD process.

23. The method of claim 12 wherein the amine is applied to the metal preferably within 4 hours after the metal is deposited.

24. A method of using a sacrificial protective layer in a damascene process comprising:
   providing a substrate upon which a dielectric layer has been formed,
   forming an opening in said dielectric layer,
   depositing a barrier layer on the sidewalls and bottom of said opening in said dielectric layer,
   depositing a metal in said opening,
   forming a sacrificial protective layer on said metal by treating the metal layer with an amine that forms a complex of the type $M^{+1}(amine^{-1})$ or $M^{+2}(amine^{-1})_2$, and
   removing unreacted amine from the substrate.

25. The method of claim 24 further comprising the step of removing the amine complex in a subsequent chemical mechanical polish step.

26. The method of claim 24 wherein the amine is applied by dipping, spin coating, spraying or by a CVD process.

27. The method of claim 24 wherein the amine is removed by baking, by applying a vacuum, or by rinsing with DI water and drying.

28. The method of claim 24 wherein the amine is selected from a group consisting of benzotriazole and its derivatives and benzimidazole and its derivatives.

29. The method of claim 24 wherein said metal is copper, aluminum or an aluminum/copper alloy.

30. The method of claim 24 wherein said sacrificial protective layer is a monolayer with a thickness in a range of about 10 Angstroms to about 50 Angstroms.

* * * * *